US006642543B1

(12) United States Patent
El Gamal et al.

(10) Patent No.: US 6,642,543 B1
(45) Date of Patent: Nov. 4, 2003

(54) THIN AND THICK GATE OXIDE TRANSISTORS ON A FUNCTIONAL BLOCK OF A CMOS CIRCUIT RESIDING WITHIN THE CORE OF AN IC CHIP

(75) Inventors: Abbas El Gamal, Palo Alto, CA (US); Xinqiao Liu, Palo Alto, CA (US); Sukhwan Lim, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/670,484

(22) Filed: Sep. 26, 2000

(51) Int. Cl.$^7$ .............................................. H01L 29/04
(52) U.S. Cl. .......................... 257/72; 257/291; 257/296
(58) Field of Search ................................ 257/351, 357, 257/369–371, 390, 274, 72, 296, 291

(56) References Cited

U.S. PATENT DOCUMENTS

| | | | |
|---|---|---|---|
| 5,266,507 A | 11/1993 | Wu | 437/41 |
| 5,293,052 A | 3/1994 | Cherne et al. | 257/349 |
| 5,604,150 A | 2/1997 | Mehrad | 437/70 |
| 5,960,319 A | 9/1999 | Iwata et al. | 438/664 |
| 6,051,509 A * | 4/2000 | Tsuchiaki | |
| 6,060,510 A | 5/2000 | Brusilow | 514/533 |
| 6,278,131 B1 * | 8/2001 | Yamazaki et al. | |
| 6,307,236 B1 * | 10/2001 | Matsuzaki et al. | |

OTHER PUBLICATIONS

Hon–Sum Wong, "Technology and device scaling considerations for CMOS imagers," IEEE Transactions on Electron Device, vol. 43, No. 12, Dec. 1996.
E. R. Fossum, "CMOS image sensors: electronic camera–on–chip," IEEE Transactions on Electron Device, vol. 44, No. 10, Oct. 1996.
N. Stevanovic et al., "A CMOS image sensor for high speed imaging," ISSCC Dig. Tech. Papers, pp. 104–105, Feb. 2000.
S. Kleinfelder et al., "A 10,000 frames/s 0.18$\mu$M CMOS digital pixel sensor with pixel–level memory," ISSCC Dig. Tech. Papers, Feb. 2001.
A. El. Gamal et al., "Pixel level processing why?, what?, and how?" Proceedings of the SPIE, vol. 3650, pp. 2–13, Jan. 1999.
"Physical Verification Manufacturability & Analysis," 2.2 The CMOS Process, pp 1–6, retrieved on May 15, 2002. Retrieved from the internet: <URL:http://www.edatoolscafe.com/Book/CH02/CH02.2.htm>.
H.–S. Philip Wong, "Beyond the Conventional MOSFET," retrieved on May 15, 2002. Retrieved from the internet: <URL:http://www.eurotraining.net/ESSCIRC_2001/essderc_2001/data/412.pdf>.
Prof. Bernd–Peter Paris, Dec. 14, 1998, "CMOS Logic Gates," retrieved on May 15, 2002. Retrieved for the internet: <URL:http://thalia.spec.gmu.edu/~pparis/classes/notes_101/node 103.html.
Dennis Sylvester, "The Rise (and Fall?) of CMOS in VLSI Design," Univ. of Mitchigan, Feb. 20, 2002, retrieved from the internet:URL:http://www.wwcs.umich.edu/~dennis/talks/ieee 022002.pdg on May 15, 2002.
A. Krymski et al., "A High Speed 500 Frames/s, 1024x1024 CMOS Active Pixel Sensor," 1999 Symposium on VLSI Circuits Digest of Technical Papers.

* cited by examiner

*Primary Examiner*—Fetsum Abraham
(74) *Attorney, Agent, or Firm*—Lumen Intellectual Property Services, Inc.

(57) ABSTRACT

A functional block for a CMOS circuit within the core of an integrated circuit chip and a method of making the same is disclosed. The functional block uses both thick and thin gate oxide transistors which reduces the leakage current and increases the voltage swing while permitting the device scaling in circuits made in CMOS technology. Within the functional block, the distance between a thick oxide transistor and a thin oxide transistor is chosen based on a transistor stability criterion. The thick and thin oxide transistors can be connected to identical or different voltage sources. Further, a transistor within a functional block can be chosen to be thick or thin oxide transistor based on a leakage current threshold or a voltage swing threshold.

8 Claims, 11 Drawing Sheets

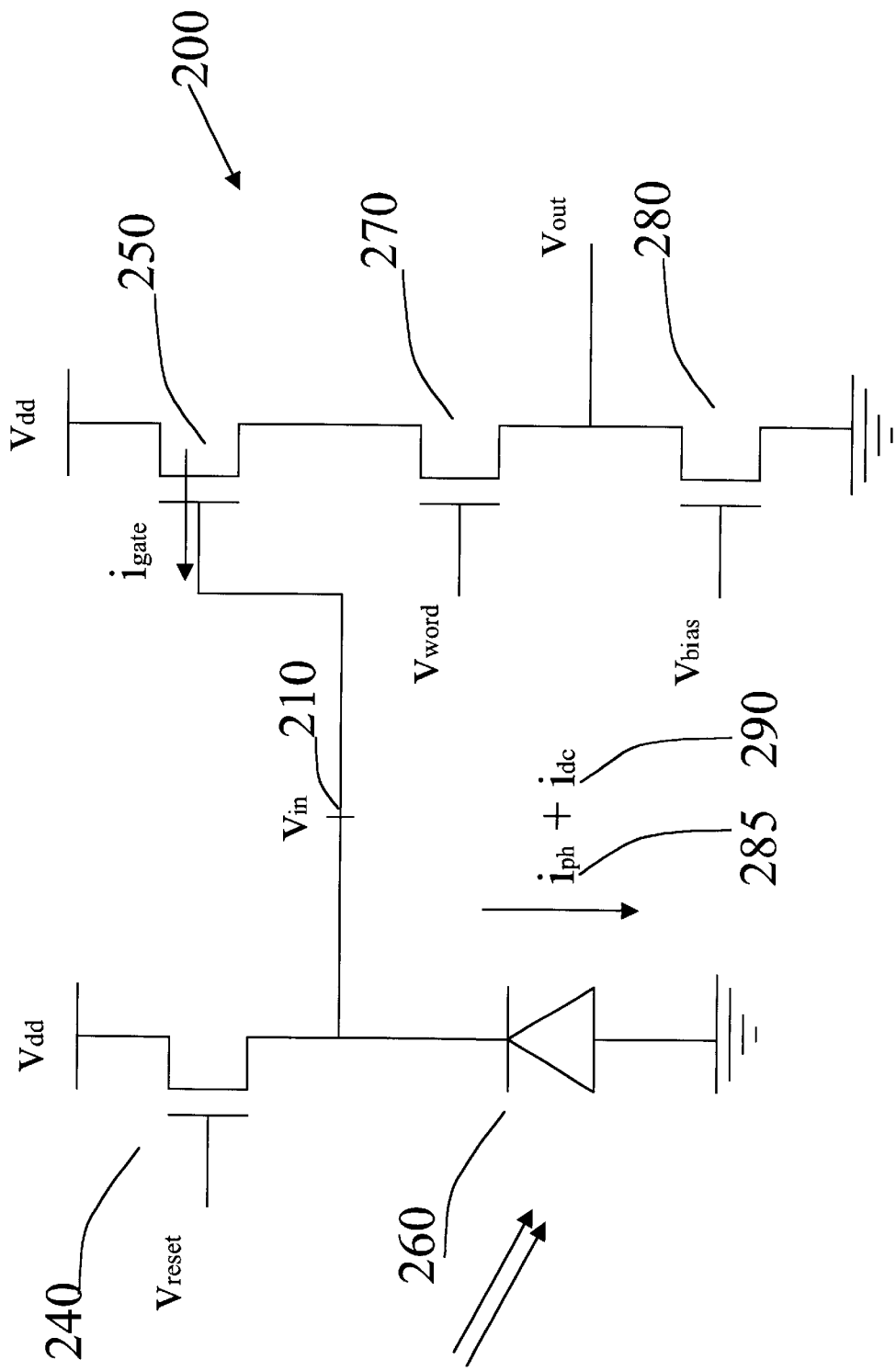
Figure-2 [Prior Art]

THIN AND THICK GATE OXIDE TRANSISTORS ON A FUNCTIONAL BLOCK OF A CMOS CIRCUIT RESIDING WITHIN THE CORE OF AN IC CHIP

FIELD OF INVENTION

This invention relates in general to semi-conductor integrated circuits design and more particularly to CMOS integrated circuits with dual gate oxide thickness transistors in advanced manufacturing technology.

BACKGROUND OF THE INVENTION

CMOS technology has powered the revolution in computing capability due to the long trend of performance and density gains with scaling. The steady downscaling of CMOS device dimension has been the main stimulus to the growth of micro electronics and computer industry over the past two decades.

As the channel length scales down, the supply voltage and gate oxide thickness also scale down. The supply voltage must be reduced with scaling as the active power, which is proportional to the square of supply voltage, and electric field will exceed reasonable limits. A high electric field can lead to a number of deleterious effects that could impact chip reliability.

Examples are hot-carrier injection into the gate oxide and electromigration due to the increased current density.

At short channel lengths the phenomenon called the "short channel effect" looms large. To keep the short channel effect under control gate oxide thickness is reduced nearly in proportion to channel length. A simple rule is that the gate oxide thickness needs to be about $\frac{1}{50}$ to $\frac{1}{25}$ of channel length. When this rule is applied in further down-scaling, the necessary reduction in gate oxide thickness eventually results in a thickness so small that it is vulnerable to quantum-mechanical tunneling which gives rise to gate leakage current that increases exponentially with decreasing oxide thickness as the oxide thickness is scaled down.

FIG. 1 shows the gate leakage current density ($A/cm^2$) versus various gate oxide thicknesses (nm). It can be seen from plot 110 that the gate leakage current increases exponentially with decreasing gate oxide thickness. Increased leakage current causes undesired effects such as corrupted dynamic signals and increased standby power dissipation etc. Scaling of supply voltage reduces the voltage swing, which is detrimental to analog circuit performance in general.

FIG. 2 shows, a functional block 200. For the purposes of illustration an APS (Active Pixel Sensor) circuit is shown in this figure. This figure illustrates an APS (Active Pixel sensor) pixel and part of read out circuit 200 as a functional block. The circuit consists of source follower transistor 250, reset transistor 240, photo diode 260 and read out transistors 270 and 280. The maximum voltage on node Vin 210 is Vmax=Vdd−Vt, where Vdd is the power supply voltage and Vt is the transistor threshold voltage of reset transistor 240. The minimum voltage on node Vin 210 is Vmin=Vdsat+Vt, where Vdsat is the overdrive voltage above the threshold voltage Vt. In this case, Vdsat=Vgs−Vt, where Vgs is the voltage difference between transistor gate and source. The typical value of Vdsat is 0.2V. Therefore the voltage swing at the node Vin 210, $$Vswing = Vmax - Vmin$$
$$= Vdd - 2Vt - Vdsat.$$

As the technology scales, Vdd and Vt (upto certain limit) scale approximately linearly with channel length which reduces the voltage swing. FIG. 3 shows the trend in values of Vdd, Vt and gate oxide thickness (tox) as the technology scales. The plot 310 depicts the drop in power supply voltage Vdd while the channel length decreases. The plot 320 depicts the drop in the threshold voltage Vt with the reduction in channel length. The plot 330 shows the drop in gate oxide thickness with the reduction in channel length.

The saturation voltage Vdsat generally remains constant and does not depend upon technology scaling. As Vdsat does not scale with technology, voltage swing reduces faster than linearly. FIG. 4 shows the simulated Vswing for the functional block under consideration.

As the technology scales down, the voltage swing reduces below acceptable levels and the resulting thin gate oxide layer causes high leakage currents, which causes further undesirable effects.

It would be an advance in the art to enable further dimensional downscaling of CMOS circuits while achieving acceptable performance characteristics such as a large voltage swing and low leakage currents.

OBJECTS AND ADVANTAGES

In view of the above, it is an object of the invention to obtain acceptable voltage swings while permitting the device scaling in circuits made in CMOS technology.

It is another object of the invention to have reduced leakage currents resulting in acceptable performance in circuits made in CMOS technology.

Further objects and advantages will become apparent upon reading the following description of the invention and its various embodiments.

SUMMARY

The present invention describes the use of thin and thick gate oxide transistors in a functional block of a CMOS circuit within the core of an integrated circuit chip. The functional block comprises a first transistor having a thick gate oxide and a second transistor having a thin gate oxide being placed at a predetermined distance from the first transistor, whereby restricting the functional block to a predetermined area.

In one embodiment, the predetermined distance between the thin and thick gate oxide transistors is chosen based on a transistor stability criterion. The distance between the thin and thick transistors generally depends on the minimum channel length of the CMOS technology used and the power supply voltage applied to the transistors.

The techniques of the invention can be used among others, in the functional blocks such as operational amplifiers, 3T DRAM cells and image sensor pixels. The functional block can be a part of an image sensing system, a communication system, a memory circuit, a multi-media system, an embedded system, a signal processing chip, an analog signal circuit and a mixed signal circuit.

In one embodiment, the functional block comprises at least one photosensitive element. Such functional block in one case forms part of a CMOS image sensor circuit. A photo diode or a photo gate could be used as the photosensitive element in the above described circuit.

In another embodiment of the invention, a high voltage source is connected to the thick oxide transistors and a low voltage source is connected to the thin oxide transistors. Alternatively, both thin and thick oxide transistors are connected to an identical voltage source.

The present invention also provides for a method of making a functional block using thin and thick oxide transistors for a CMOS circuit within the core of an IC chip. The method includes growing a first transistor, having a thick gate oxide and growing a second transistor having a thin oxide at a predetermined distance from the first transistor. In one embodiment, the transistor growth process is based on a first mask for the thick oxide transistors and a second mask for the thin oxide transistors. The transistor growth process can further include use of different masks for a LDD implantation.

The invention further includes the techniques for choosing a transistor in a functional block based on a gate leakage current threshold and/or a voltage swing threshold.

BRIEF DESCRIPTION OF THE FIGURES

FIG. 2 depicts the circuit diagram of a prior art Active Pixel Sensor.

DETAILED DESCRIPTION

Figure 1:
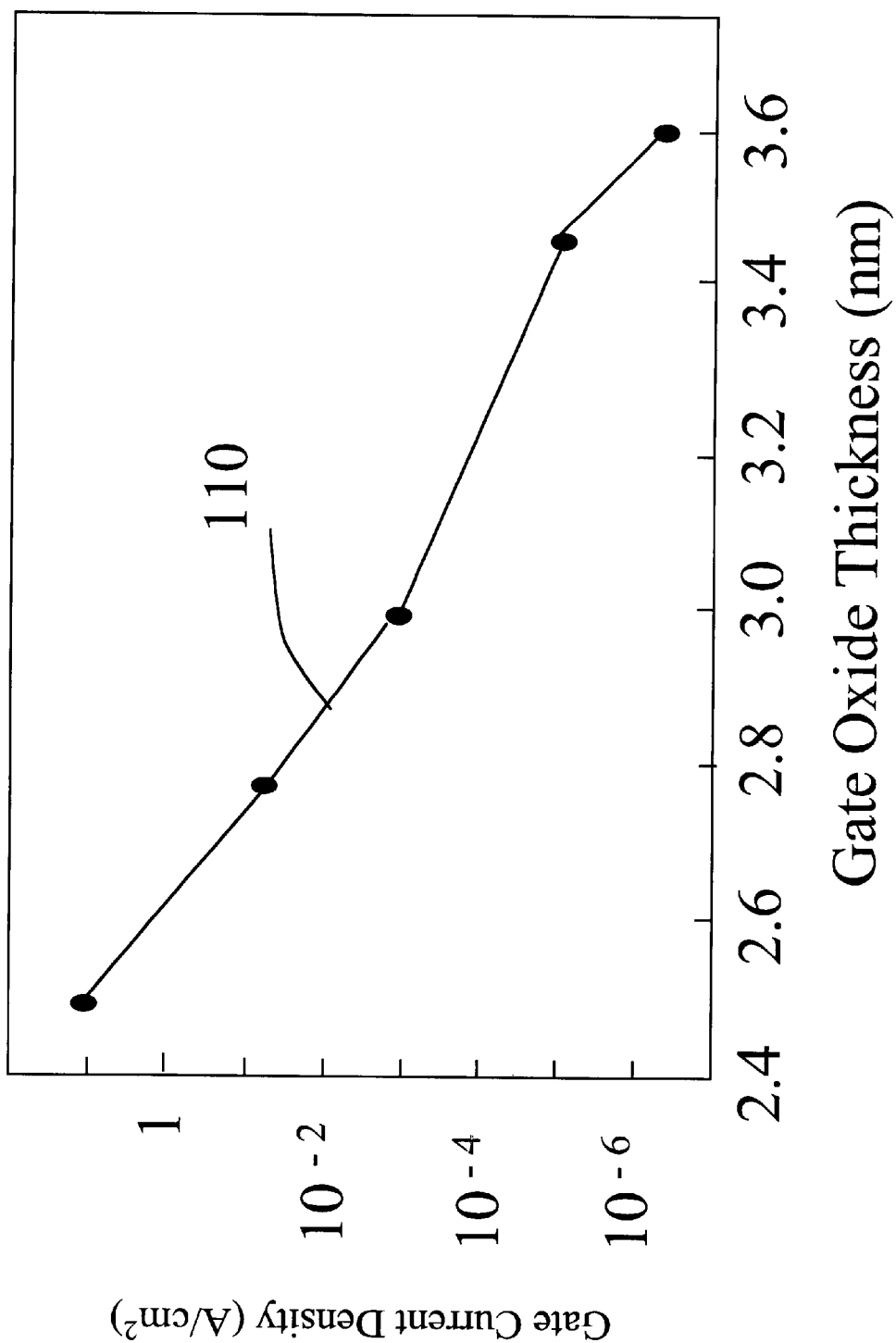
FIG. 1 shows a plot of the gate leakage current density for various gate oxide thicknesses.

The method of invention will be best understood by first considering the FIG. 2 which illustrates the circuit diagram of a functional block 200 of a CMOS circuit. The gate tunneling current (leakage current) $i_{gate}$ 220 appears as the transistor gate oxide thickness reaches the direct tunneling regime. For CMOS technologies of 0.18 $\mu$m and beyond, the gate oxide thickness needs to be approximately around 3 nm (i.e. 0.18 $\mu$m×1/50≅3 nm) or below to reduce the short channel effect discussed earlier. Referring to FIG. 1 it can be seen that the gate current density for gate oxide thickness of 3 nm is approximately $10^{-1}$ A/cm$^2$. This is many orders of magnitude higher than the typical photo diode dark current density $i_{dc}$ 290. The dark current is the photodetector leakage current that is not induced by photogeneration which is typically less than 1 nA/cm$^2$. The photo diode 260 is directly connected to the gate of the source follower transistor 250.

Figure 2A:
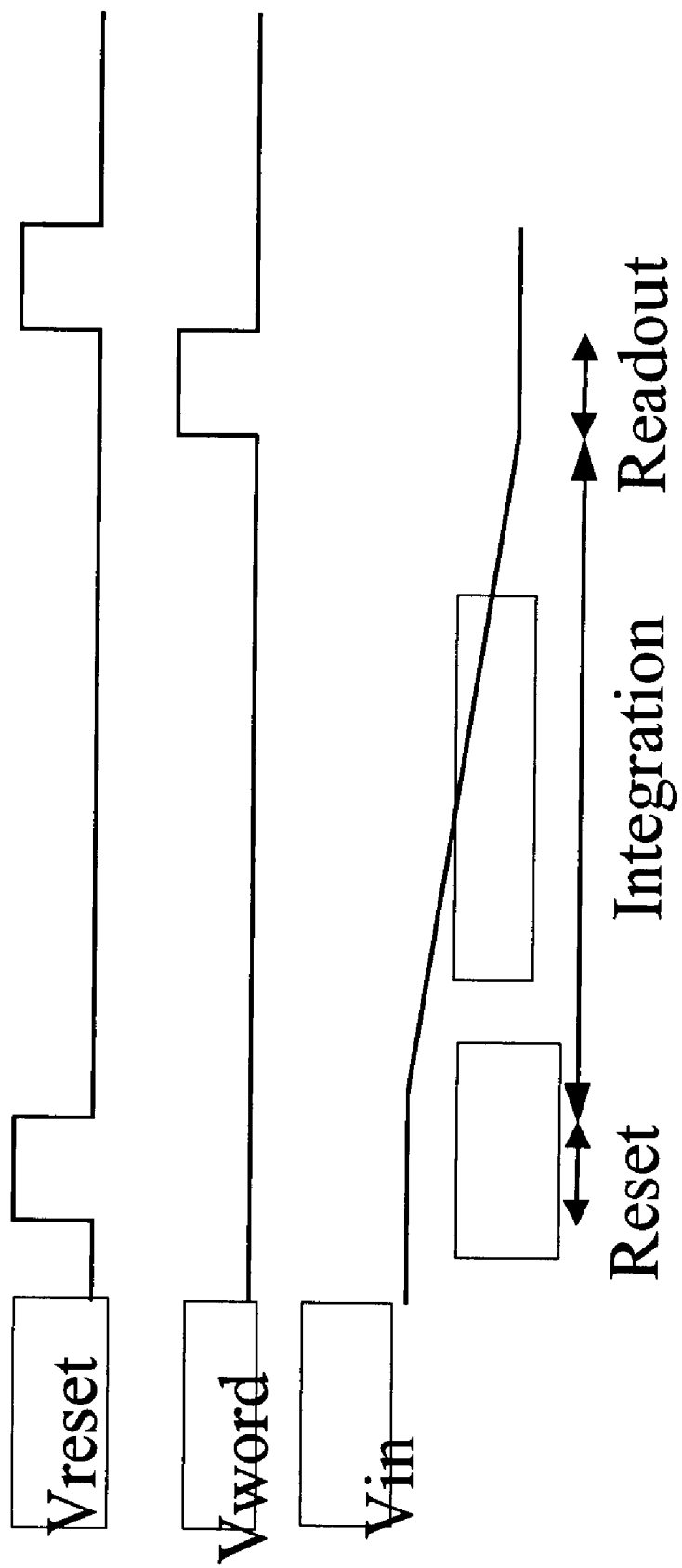
FIG. 2A is the timing diagram of an Active Pixel Sensor circuit.
Figure 3:
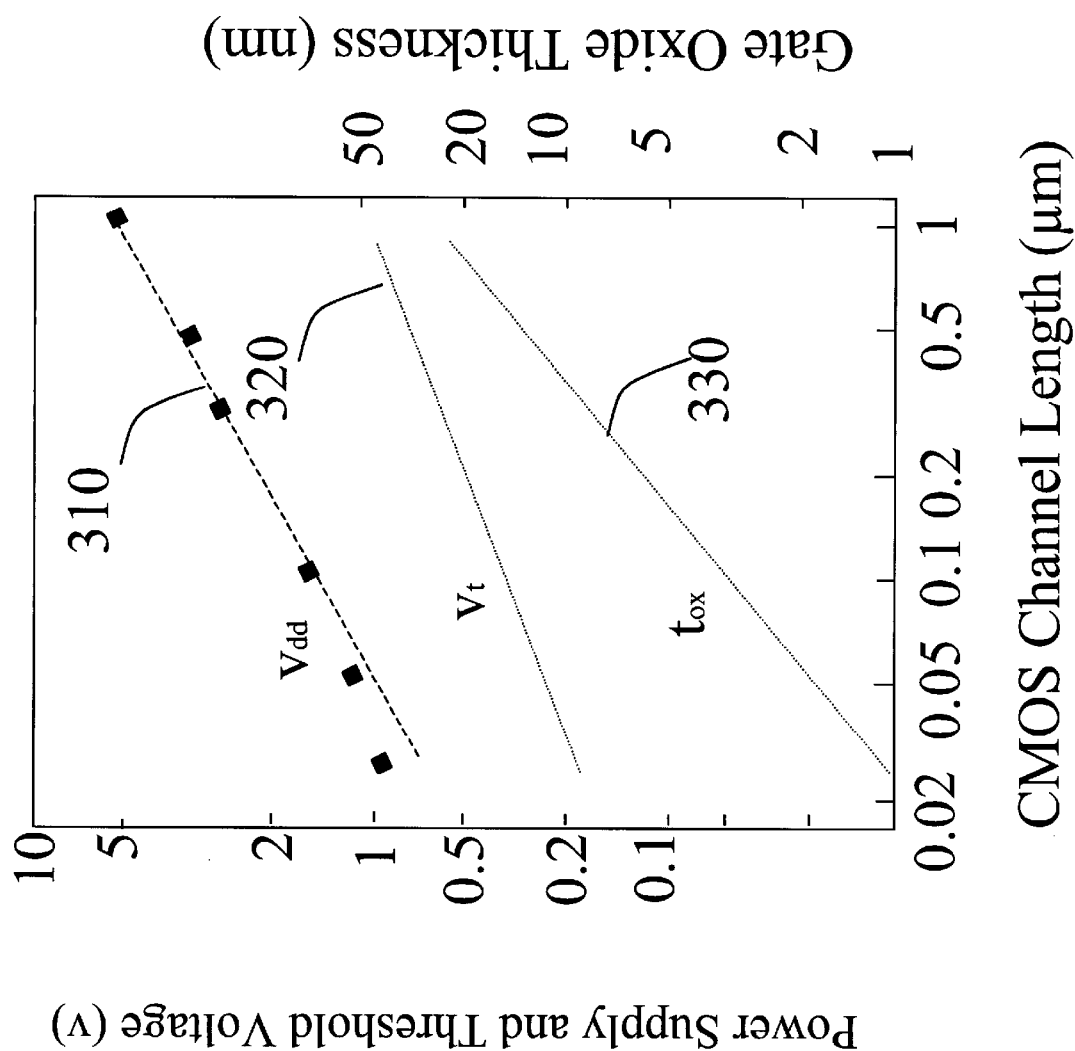
FIG. 3 shows the trend in values of power supply voltage, transistor threshold voltage and gate oxide thickness as the technology scales.

The APS operation includes three phases. A reset phase, an integration phase and a readout phase. The operation of such an APS circuit is depicted in FIG. 2A. The integration time is generally between 10 ms and 30 ms, during which the light induced photocurrent $i_{ph}$ 285 is integrated on the parasitic capacitor of the photodiode 260. The voltage on the photodiode is readout at the end of the integration phase, which represents light intensity. The dark current $i_{dc}$ 290 the gate leakage current $i_{gate}$ 220 are the unwanted signals and it is most desired that they be kept as low as possible. The existence of the dark current $i_{dc}$ 290 and the gate leakage current $i_{gate}$ 220 will affect the light detection in several aspects. For example, if $i_{dc}$ 290 and $i_{gate}$ 220 are too high, the photodetector can not detect low light intensities.

The gate leakage current $i_{gate}$ 220 during the integration phase of the APS circuit 200's operation can result in significantly higher dark current $i_{dc}$ 290. For example, in 0.18 $\mu$m channel length technology, assuming a photo diode 260 with a size of 3×3 $\mu$m$^2$, the photo current $i_{ph}$ 285 ($i_{ph}$ is the photodetector current that is induced by photogeneration) can range from tens of fAs to 1pA under normal lighting conditions. The dark current $i_{dc}$ 290 is less than 1fA, whereas the gate leakage current i gate 220 of the source follower transistor 250 with gate area of 0.08 $\mu$m$^2$ is 8fA, which is unacceptably high. As explained above, high $i_{gate}$ 220 and $i_{dc}$ 290 adversely affect the sensor performance resulting in a reduced signal to noise ratio (SNR) and reduced sensor dynamic range (the range of light intensity between which the sensor can work well).

The voltage swing (Vswing) of the APS circuit 200 is computed as follows. For example consider the various voltages of the circuit to be, Vdd=1.8 v, Vt=0.5 v, Vreset=Vdd=1.8 v, and Vdsat=0.2 v.

Then $V\max=Vdd-Vt=1.3$ v $V\min=Vdsat+Vt=0.7$ v

Figure 4:
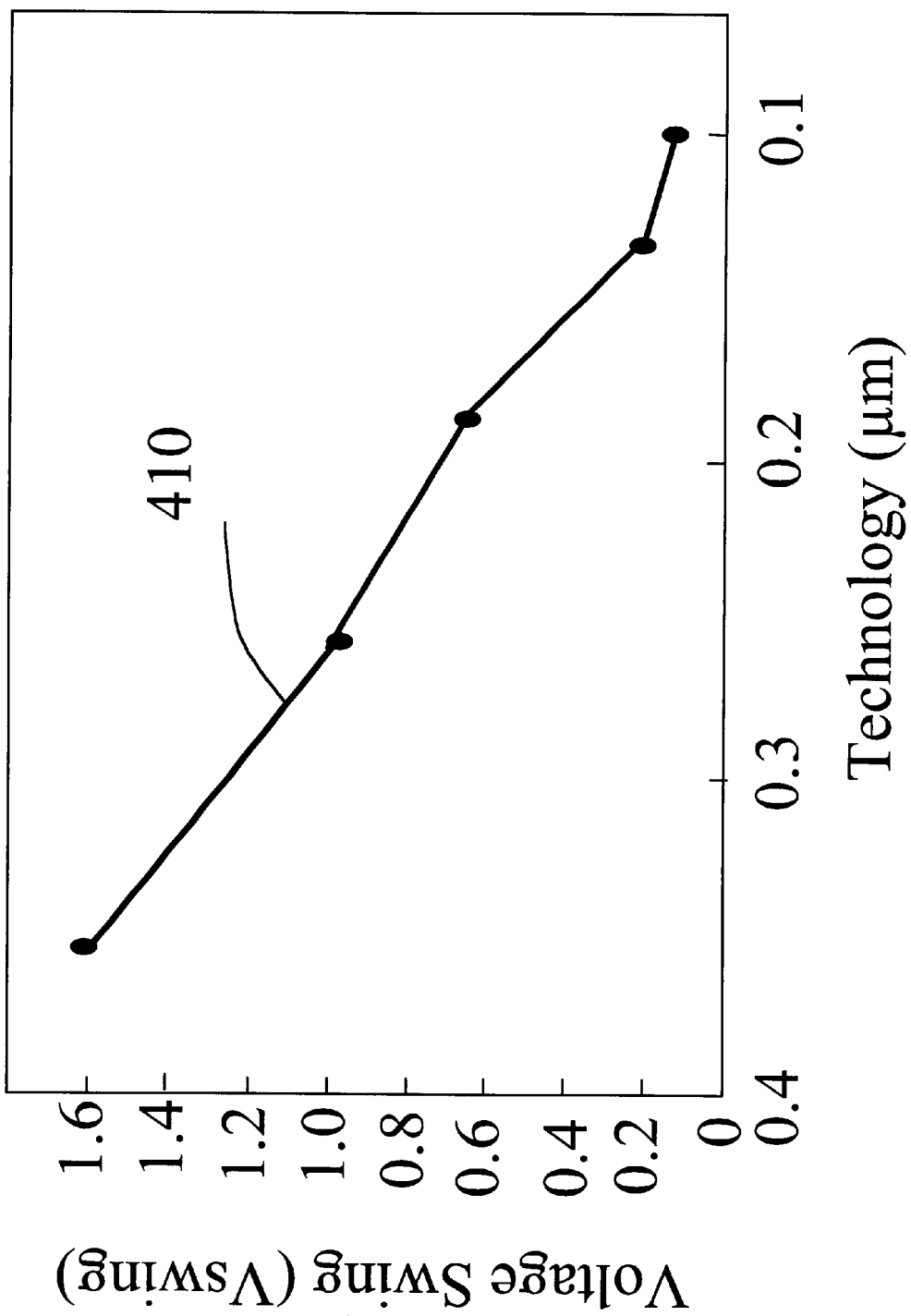
FIG. 4 shows trend of voltage swing with technology scaling.

Therefore Vswing=Vmax−Vmin 0.6 v. The voltage swing can also be observed from the plot 410 in FIG. 4.

Figure 5:
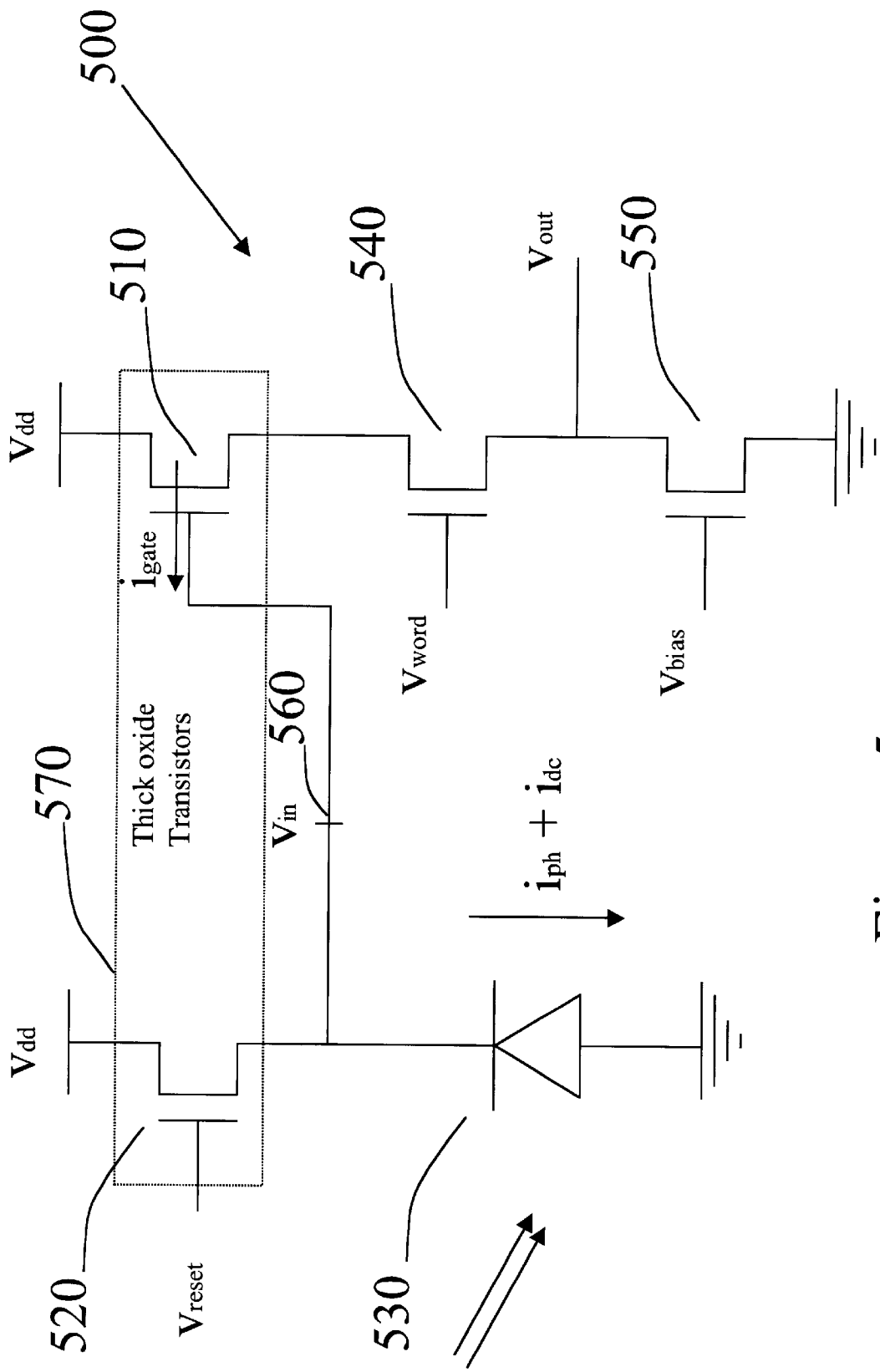
FIG. 5 depicts the circuit diagram of an Active Pixel Sensor circuit in accordance with the invention.

FIG. 5 shows an embodiment of the invention illustrating APS circuit 500. The circuit consists of source follower transistor 510, reset transistor 520, photo diode 530 and read out transistors 540 and 550.

The functional block 500, according to the invention uses both thick and thin oxide transistors to achieve low gate leakage current, high voltage swing and small area while using the standard low voltage supply. Thin oxide transistors are used wherever possible to achieve small area and low power consumption and thick gate oxide transistors are used to ensure low leakage current and to achieve higher voltage swing. In the example of 0.18 $\mu$m technology, the thin oxide gate can have a thickness of approximately 3 nm and the thick oxide gate can have a thickness of approximately 7 nm.

In the circuit 500, the source follower transistor 510 and the reset transistor 520 are thick oxide transistors and the rest of the circuit employs thin oxide transistors. Thick oxide region is indicated by the dotted box 570. As the source follower transistor 510 is a thick gate oxide transistor, the gate leakage current is reduced in comparison with the source follower transistor 210 of FIG. 2. With thick gate oxide (7 nm) transistors, the gate leakage current is at least 6 orders smaller, i.e., the gate leakage is now 8fA×1e-6 =8e-21A which is negligibly small.

In this new design shown in FIG. 5, the normal Vdd voltage for the process is used for the source follower transistor 510 which is 1.8 V in the present case. Vset and Vreset signals can however use higher voltages. For example, Vset=Vreset=3.3 v and Vdd=1.8 v. The threshold voltage Vt of thick oxide transistor is 0.8 v and Vdsat is 0.2 v. The voltage swing (Vswing) of the circuit 500 can be computed as follows.

$$Vmax = Vreset - Vt$$
$$= 3.3 \text{ v} - 0.8 \text{ v} = 2.5 \text{ v}$$
$$Vmin = Vdsat + Vt$$
$$= 0.2 \text{ v} + 0.8 \text{ v} = 1.0 \text{ v}$$
$$\text{Therefore Vswing} = Vmax - Vmin$$
$$= 2.5 \text{ v} - 1.0 \text{ v} = 1.5 \text{ v}$$

The voltage swing on node Vin 560 is 0.9 v larger than the 0.6 v voltage swing in case of the prior art circuit 200 in FIG. 2. This improved voltage swing increases sensor's dynamic range. The larger dynamic range means the sensor is not easily saturated (over-exposure is a lesser problem in this case).

The techniques of the invention can be advantageously applied to various functional blocks within the core of an IC (Integrated Circuit) chip. Applicability of the invention to functional blocks of I/O (Input/Output) circuit of an IC chip may not be attractive. For example, the driver circuits of the I/O use inverter circuits as functional blocks and it is desirable that within each of these functional blocks homogeneous thickness transistors be used.

The techniques of the invention can easily be extended to the design of any functional block of analog or mixed CMOS signal circuits. This includes circuits such as operational amplifiers, 3T DRAM (Dynamic Random Access Memory), image sensor pixel circuits etc to name a few. The invention can be used in image sensing systems, communications, memory, multimedia, embedded system etc.

It will be advantageous if the following criteria are considered while deciding whether a component of the functional block needs to be a thick oxide transistor.
  (i) Leakage current threshold
  (ii) Voltage swing threshold
  (iii) Layout considerations Of the above criteria the leakage current threshold is always desirable to be kept low. This threshold value will depend upon desired performance characteristics expected of the device. For example, in case of image sensing circuits it may be desirable to detect very low intensity lights. To enable such low light intensity detection, the leakage current should be kept low. In the circuit 500, the source follower transistor 510 and the reset transistor 520 are chosen to be thick oxide transistors to ensure that the leakage current is kept below the above mentioned threshold.

High voltage swing is desirable for analog circuits but may not be for digital circuits. Therefore, a higher threshold value for voltage swing should be set for analog circuits and a lower threshold value can be set for digital circuits. The choice of thick or thin oxide transistors will now depend on these threshold criteria.

Layout considerations are basically area and power constraints in situations where designers can not afford to use thick oxide for every transistor. Area constraint will be made clear later in the description. Power constraint is that the thick oxide transistors consume more power compared to thin oxide transistors as the thick oxide transistors need higher power supply voltage Vdd for a same value of current. Note that the power consumed is the product of supply voltage and the current.

Figure 6:
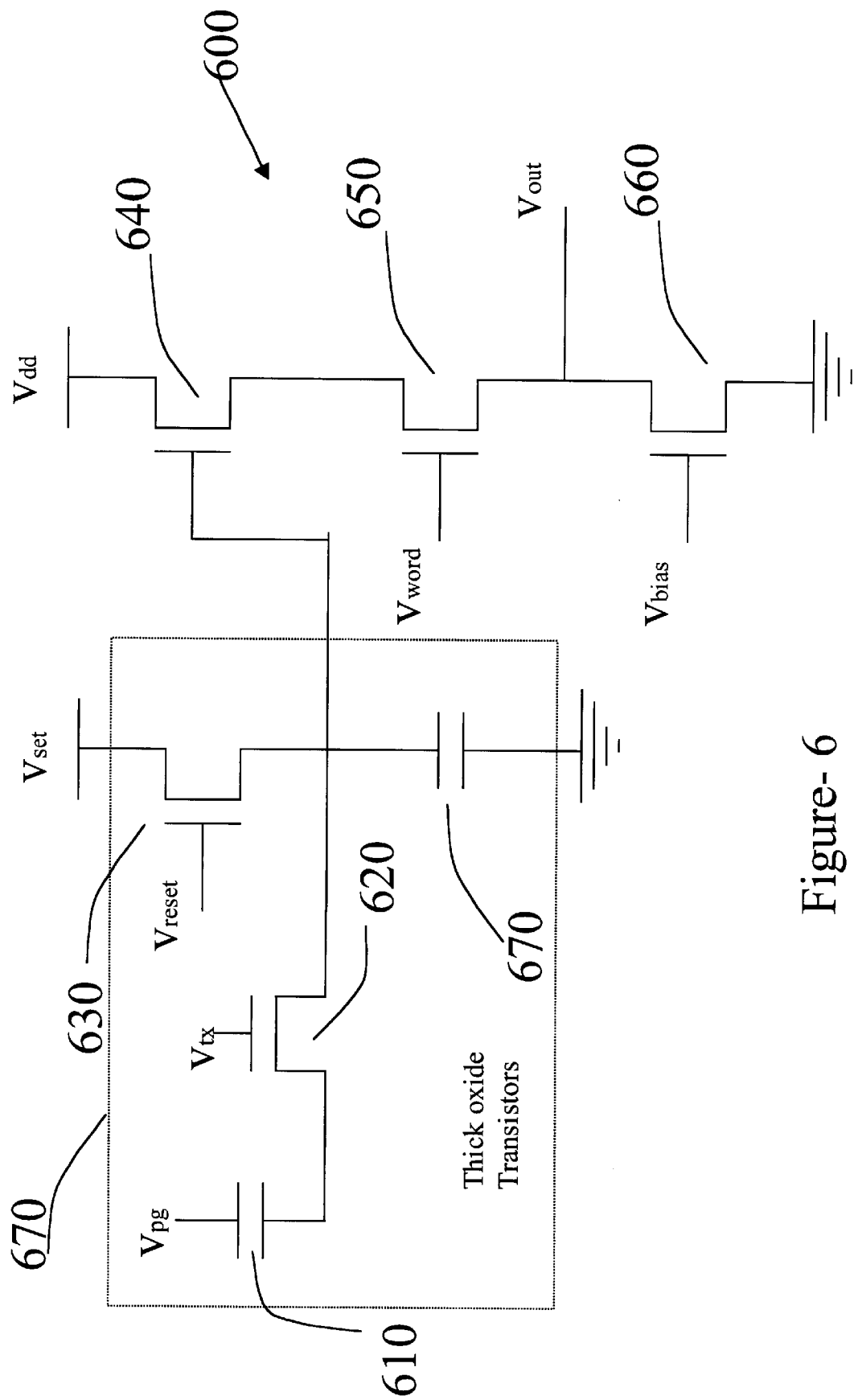
FIG. 6 shows the circuit diagram of a photogate Active Pixel Sensor circuit in accordance with the invention.

FIG. 6 depicts another embodiment of the invention. In this embodiment the functional block 600 is a photogate APS circuit. The functional block 600 consists of photogate 610, transfer device transistor 620, reset transistor 630, sensing capacitor 670, source follower transistor 640 and read out transistors 650 and 660. In this embodiment, the photogate 610, transfer device 620 reset transistor 630 and sensing capacitor 670 are thick oxide transistors. Note that sensing capacitor 670 is a transistor, which is obtained by grounding the drain and source nodes of this transistor. The rest of the circuit is thin oxide transistors. Thick oxide region is indicated by the dotted block 670. The:use of thick gate oxide transistor as the photogate and the application of high gate bias voltage Vpg of 3.3 v (note that the value of Vpg in case of thin gate oxide photogate is 1.8 v) reduce the gate leakage current and improves quantum efficiency. Quantum efficiency is the photodetection. efficiency, i.e. the number of photons required to generate one electron.

Figure 6A:
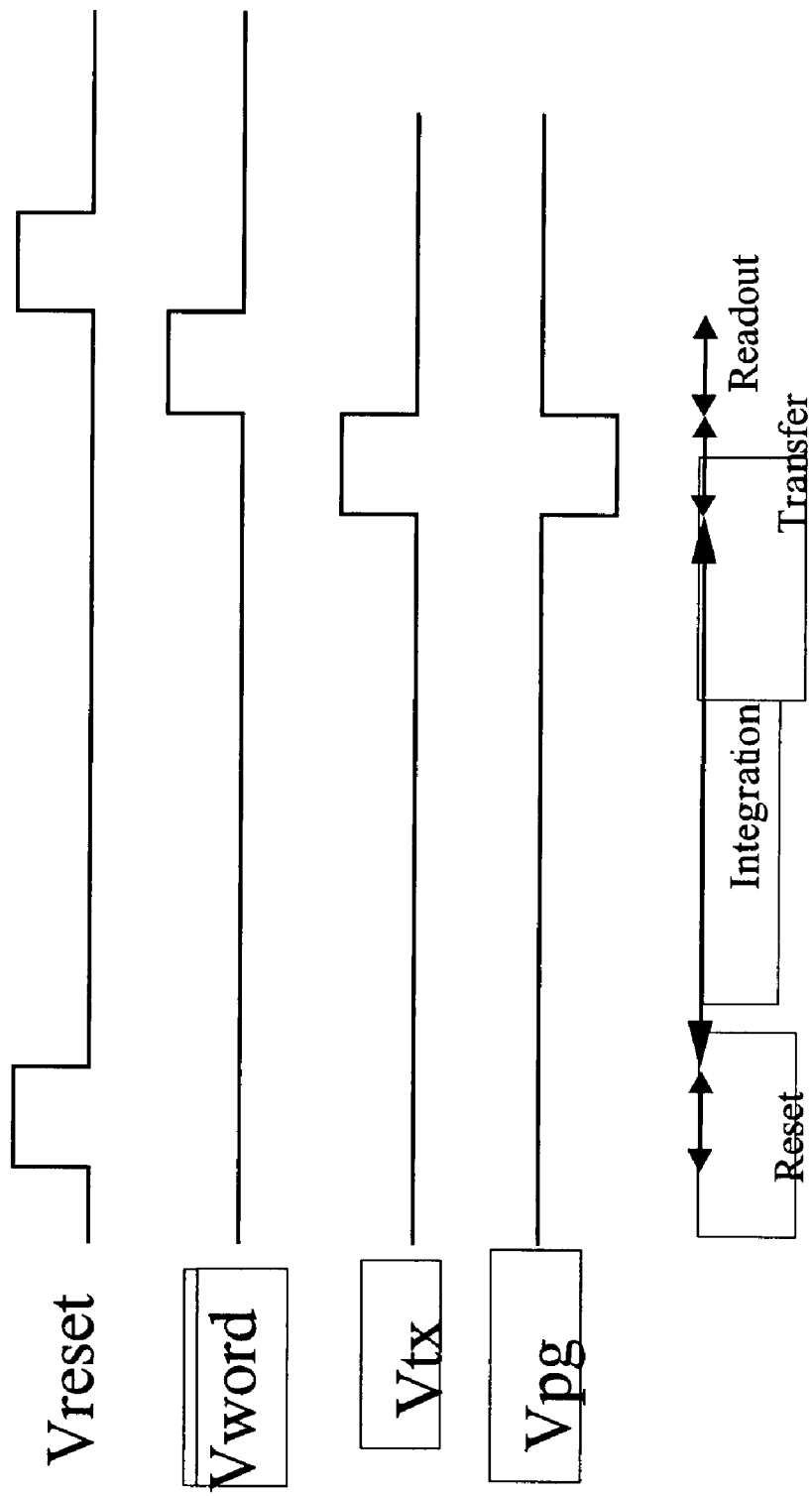
FIG. 6A is the timing diagram of the photogate Active Pixel Sensor circuit.

The use of thick oxide transistor as transfer device transistor 620 is motivated by low off current and layout considerations. As the transfer device transistor 620 is physically right next to the photogate 610, the use of thick oxide for transfer device achieves smaller area than using thin gate oxide. Note that unlike in the case of APS pixel circuit using photodiode 530 in FIG. 5, the source follower transistor 640 of circuit 600 is a thin oxide transistor. The reason for the above is that the gate of the source follower transistor 640 is not connected to the charge collection node during integration phase. The operation of the circuit 600 during the integration phase is similar to the operation of the circuit 200 and circuit 500 during the integration phase as described earlier, however note that the integrated photocharge is stored on the photogate 610 and not in capacitor 670 during integration. FIG. 6A depicts the timing diagram of circuit 600. At the end of integration, the charge is transferred from photogate 610 to capacitor 670. Following the transfer phase is the readout phase. Readout time in this case is typically less than 1 ms. During readout, the charge can leak through the gate of 640, and one way to prevent this happening is using thick oxide for source follower transistor 640. However, since the readout time is short (<1 ms) and the amount of charge leaked is thus negligible and therefore the source follower transistor 640 is chosen to be thin oxide transistor.

Figure 7:
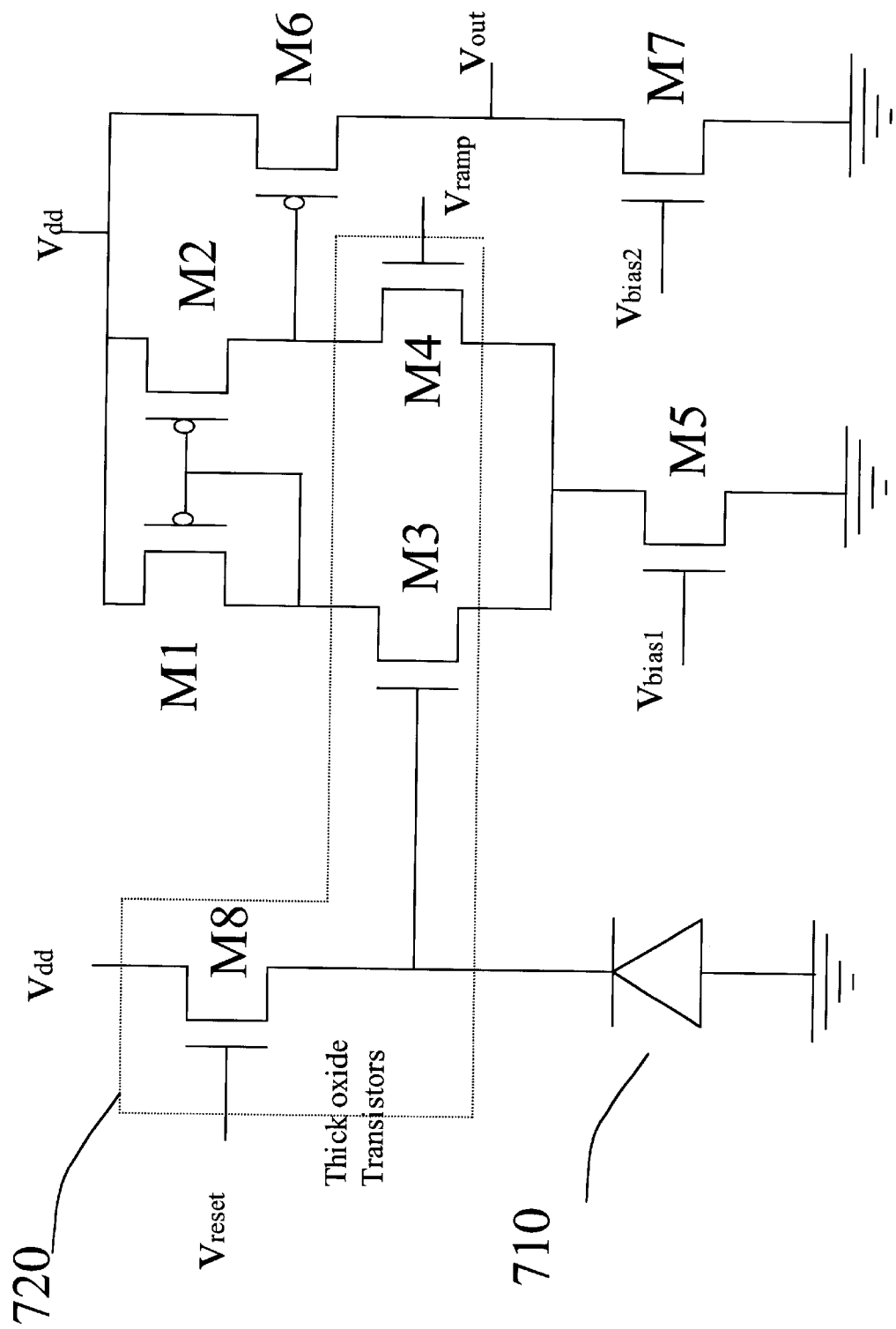
FIG. 7 shows the circuit diagram of a Digital Pixel Sensor circuit using photodiode as the image sensor element in accordance with the invention.
Figure 8:
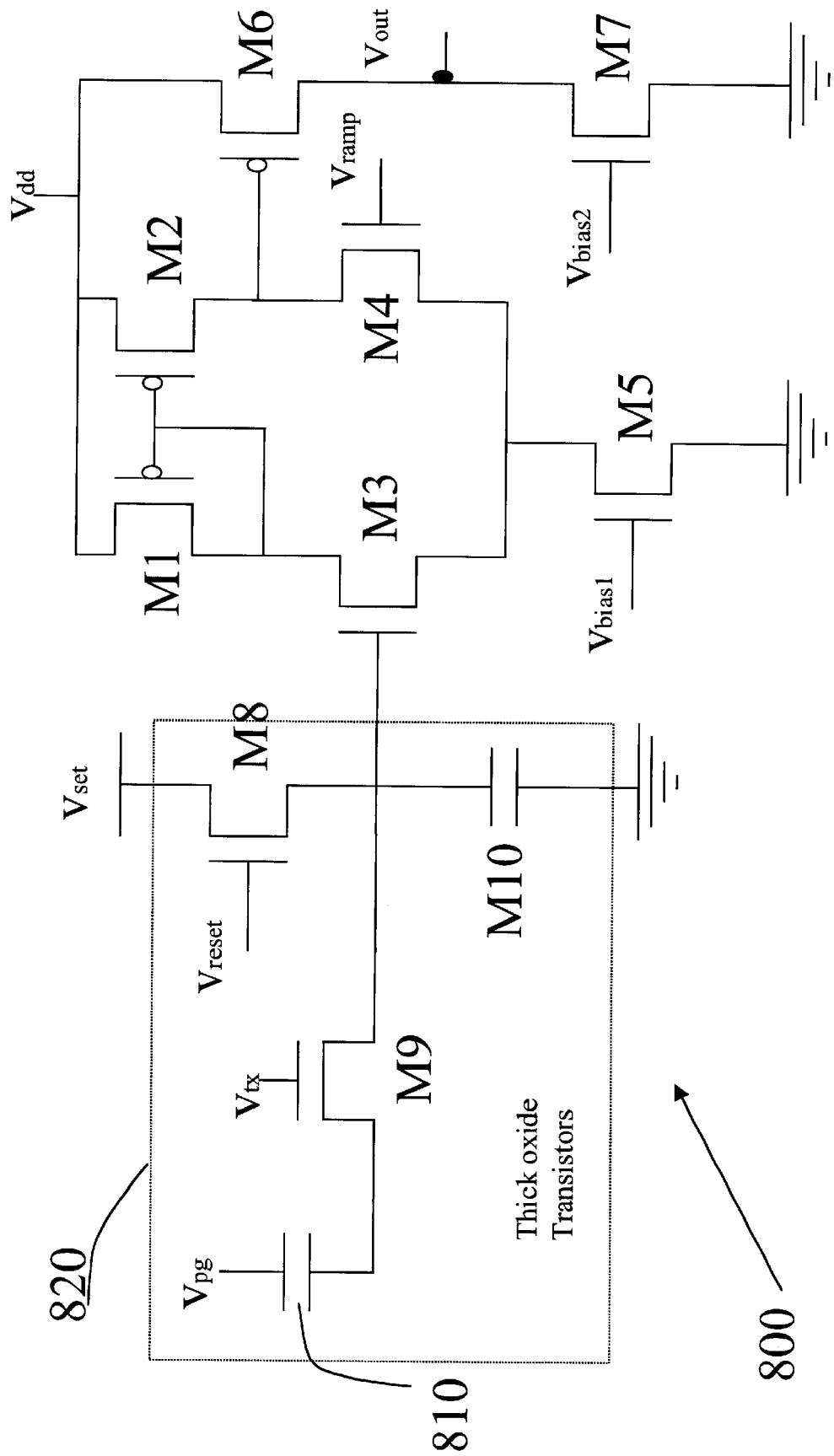
FIG. 8 shows the circuit diagram of a Digital Pixel Sensor circuit using photogate as the image sensor element in accordance with the invention.

FIG. 7 and FIG. 8 depict two different embodiments of the invention. FIG. 7 shows the implementation of a Digital Pixel Sensor (DPS) pixel circuit 700 using thin and thick gate oxide transistors according to the techniques of the invention. The circuit 700 uses a photo diode 710 as the image sensor element. In addition, the circuit 700 consists of the reset transistor M8, the input transistors M3 and M4, the load transistors M1 & M2, bias transistors M5 & M7, and the second stage follower transistor M6. The dotted box 720 contains the thick oxide transistors and the rest are thin oxide transistors.

FIG. 8 depicts the implementation of a Digital Pixel Sensor (DPS) pixel circuit 800 using thin and thick gate oxide transistors according to the techniques of the invention. The circuit 800 uses a photogate 810 as the image sensor element. In addition, the circuit 800 consists of the reset transistor M8 the transfer transistor M9, the sensing capacitor M10, the load transistors M1 & M2, bias transistors M5 & M7, and the second stage follower transistor M6. The dotted box 820 contains the thick oxide transistors and the rest are thin oxide transistors.

Technical considerations while designing the dual gate oxide thickness devices of the invention are discussed below.

The thick oxide transistors have different electrical characteristics from the thin oxide transistors such as threshold voltage, drain current density and trans-conductance. Detailed circuit analysis need to be carried out during design process in order to achieve proper operation.

During the fabrication of the CMOS devices according to the invention special risks needed to be added to the normal process to identify the different gate oxide thicknesses. Preferably, a thick oxide transistor is identified by a first mask and a thin oxide transistor is identified by a second mask.

In addition to the above, the two types of transistors may need two different masks for the LDD (Lightly Doped Drain) implantation. The LDD implantation is one special step in CMOS process to reduce the hot electron effect and is known in the art.

When thin oxide transistors are grown next to thick oxide transistors certain distance must be maintained between them to ensure transistor stability. This distance will depend on the minimum channel length of the CMOS technology used and the power supply voltage used as the transistor stability is directly affected by the electric field present in the transistor region. In addition, the distance needs to be maintained between the thin and thick oxide transistors can also be a manufacturing consideration. For example, in a standard 0.18 μm process, the minimum distance between two thin oxide transistors is 0.28 μm while a minimum distance of 0.36 μm should be kept between thin and thick oxide transistors to avoid the above mentioned active region breakdown.

The use of the invention in the design of image sensor pixels makes the pixels small in size, which finally results in a small sensor size. This lowers the cost.

Figure 9:
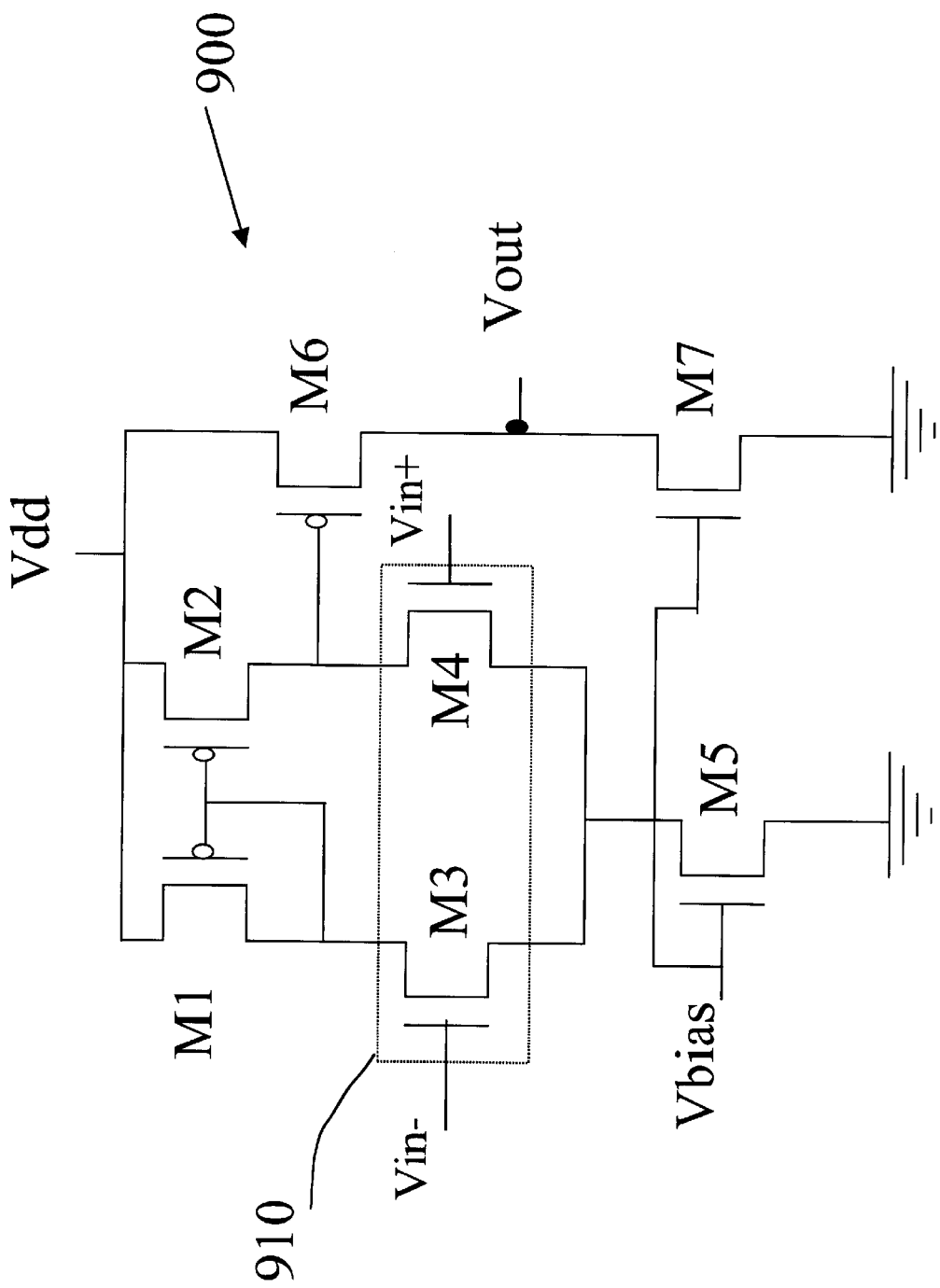
FIG. 9 shows the circuit diagram of an operational amplifier in accordance with the invention.

FIG. 9 depicts another embodiment of the invention. In this case operational amplifier 900 is shown. In this functional block 900 the input transistors M3 and M4 are thick oxide transistors. The load transistors M1 & M2, bias transistors M5 & M7, and the second stage follower transistor M6 in the circuit 900 are thin oxide transistors.

A homogeneous thin oxide transistor approach can achieve lower power consumption (as Vdd=1.8 v) while suffering from small input voltage swing of 0.9 v.

A homogeneous thick oxide transistor approach increases input swing to 2.3 v while having a higher power consumption (as Vdd=3.3 v).

The embodiment of the invention depicted in FIG. 9 achieves both higher input voltage swing (2.3 v) and low power consumption at the same time (as Vdd=1.8 v).

It should be understood that the techniques of invention could be used to design and implement various types of functional blocks of CMOS circuit as explained before in the description.

It will be clear to one skilled in the art that the above embodiments may be altered in many ways without departing from the scope of the invention. Accordingly, the following claims and their legal equivalents should determine the scope of the invention.

What is claimed is:

1. A functional block of a CMOS circuit, said functional block comprising:

a) at least a first transistor having a thick gate oxide; and
   b) at least a second transistor having a thin gate oxide and being placed at a predetermined distance from said first transistor; wherein
      said functional block is selected from the group consisting of an amplifier, a memory circuit, and a pixel circuit, wherein
         said predetermined distance is chosen based on a minimum channel length of said CMOS circuit and power respectively applied to said first and second transistors, and wherein
            said CMOS circuit resides within the core of an integrated circuit chip.

2. The functional block of claim 1, wherein said thick gate oxide has a thickness of approximately 7 nm and said thin gate oxide has a thickness of approximately 3 nm.

3. The functional block of claim 1, wherein said first transistor is selected from the group consisting of source follower transistors, reset transistors, photogates, sensing capacitors, transfer device transistors, and input transistors.

4. The functional block of claim 1, wherein said functional block is a part of a device selected from the group consisting of an image sensing device, a communication device, a memory device, a multi-media device, a signal processing chip, an image pixel sensor, an active pixel sensor, a digital pixel sensor, an operational amplifier, a dynamic random access memory, an analog CMOS signal circuit, and a mixed CMOS signal circuit.

5. The functional block of claim 1, wherein said functional block comprises at least one photosensitive element.

6. The functional block of claim 5, wherein said photosensitive element is selected from the group consisting a photodiode and a photogate.

7. The functional block of claim 1, further comprising a high voltage source connected to said first transistor and a low voltage source connected to said second transistor.

8. The functional block of claim 1, wherein both said first transistor and said second transistor are connected to an identical voltage source.

* * * * *